United States Patent [19]

Stewart

[11] Patent Number: 4,558,240
[45] Date of Patent: Dec. 10, 1985

[54] MULTI MODE AMPLIFIER

[75] Inventor: Roger G. Stewart, Neshanic Station, N.J.

[73] Assignee: RCA Corporation, Princeton, N.J.

[21] Appl. No.: 487,083

[22] Filed: Apr. 21, 1983

[51] Int. Cl.⁴ .............. H03K 5/24; H03K 3/023; G01R 19/165; G11C 7/06
[52] U.S. Cl. .............. 307/530; 307/493; 307/496; 307/362; 307/279; 365/205; 365/208
[58] Field of Search .............. 307/530, 355, 362, 279, 307/491, 493, 494, 496, 497; 365/189, 190, 196, 205, 204, 207, 208

[56] References Cited

U.S. PATENT DOCUMENTS

| | | | |
|---|---|---|---|
| 4,042,841 | 8/1977 | Hills | 307/448 X |
| 4,144,590 | 3/1979 | Kitagawa et al. | 365/205 |
| 4,195,239 | 3/1980 | Suzuki | 365/205 X |
| 4,208,730 | 6/1980 | Dingwall et al. | 307/530 X |
| 4,274,013 | 6/1981 | Clemons et al. | 307/530 |
| 4,417,163 | 11/1983 | Otsuki et al. | 365/203 X |
| 4,461,965 | 7/1984 | Chin | 307/279 X |

OTHER PUBLICATIONS

Chu et al., "Low-Power, High-Speed Sense Latch"; IBM-TDB; vol. 17, No. 9, pp. 2582-2583; 2/1975.

Primary Examiner—Larry N. Anagnos
Attorney, Agent, or Firm—Joseph S. Tripoli; George E. Haas; Henry I. Schanzer

[57] ABSTRACT

The operating potential to an amplifying section is selectively altered to cause the stages of the amplifying section to operate in the voltage follower mode during one time period and as inverters during another, succeeding time period. A selectively enabled preamplifier adapted to receive small signals which are offset with respect to the voltage rail level and which produces at its outputs, signals which tend to be centered about the midpoint of the operating potential is coupled to the amplifying section to control its gain during certain portions of the amplifying section operation.

12 Claims, 3 Drawing Figures

MULTI MODE AMPLIFIER

This invention relates to means for accurately and reliably sensing relatively small signals.

In many systems, such as high speed high density memories, the voltage difference between the high voltage level ($V_H$) indicative of a logic "1" and the low voltage level ($V_L$) indicative of a logic "0" is made significantly less than the amplitude of the operating voltage. Also, in some of these systems, the $V_H$ and $V_L$ levels are offset towards one of the operating voltage rails (e.g. $V_{DD}$ and ground). For example, while the operating voltage may be equal to 5 volts, the difference, $\Delta V$, between $V_H$ and $V_L$ may set equal to 0.5 volts with $V_H$ and $V_L$ around 5 volts and 4.5 volts, respectively, or, around 0.5 volt and 0 volts, respectively. The small signal difference and the offset of the signal levels are needed, in part, to achieve high packing density and to decrease the time it takes for a "1" or a "0" to be produced and/or sensed. However, the offset of the $V_H$ and $V_L$ signals towards either one of the voltage rails compounds the problem of accurately and reliably sensing and amplifying the small differential between $V_H$ and $V_L$. These problems are resolved in circuits embodying the invention by means of a novel amplifying means which may be combined with a preamplifier to form a novel multi-mode sense amplifier.

An amplifying means embodying the invention includes two amplifying stages, each stage having a signal input node and a signal output node with the signal output node of each stage being connected to the signal input node of the other stage. The amplifying means also includes means for selectively altering the polarity and magnitude of the operating potential applied to the amplifying means. Thus, during a first time interval, when signals are first applied to the input nodes, an operating voltage is applied to the two stages of a polarity and magnitude to cause the two stages to function as voltage followers with each stage having a voltage gain of about 1.

During a succeeding time interval, the polarity of the operating voltage to the amplifying stages is reversed causing each stage to function as an inverter.

To amplify signals which are offset relative to the voltage rails, a selectively enabled preamplifier stage is coupled to the amplifying means and controls its response while enabled.

In the accompanying drawing like reference characters denote like components, and:

Figure 1:
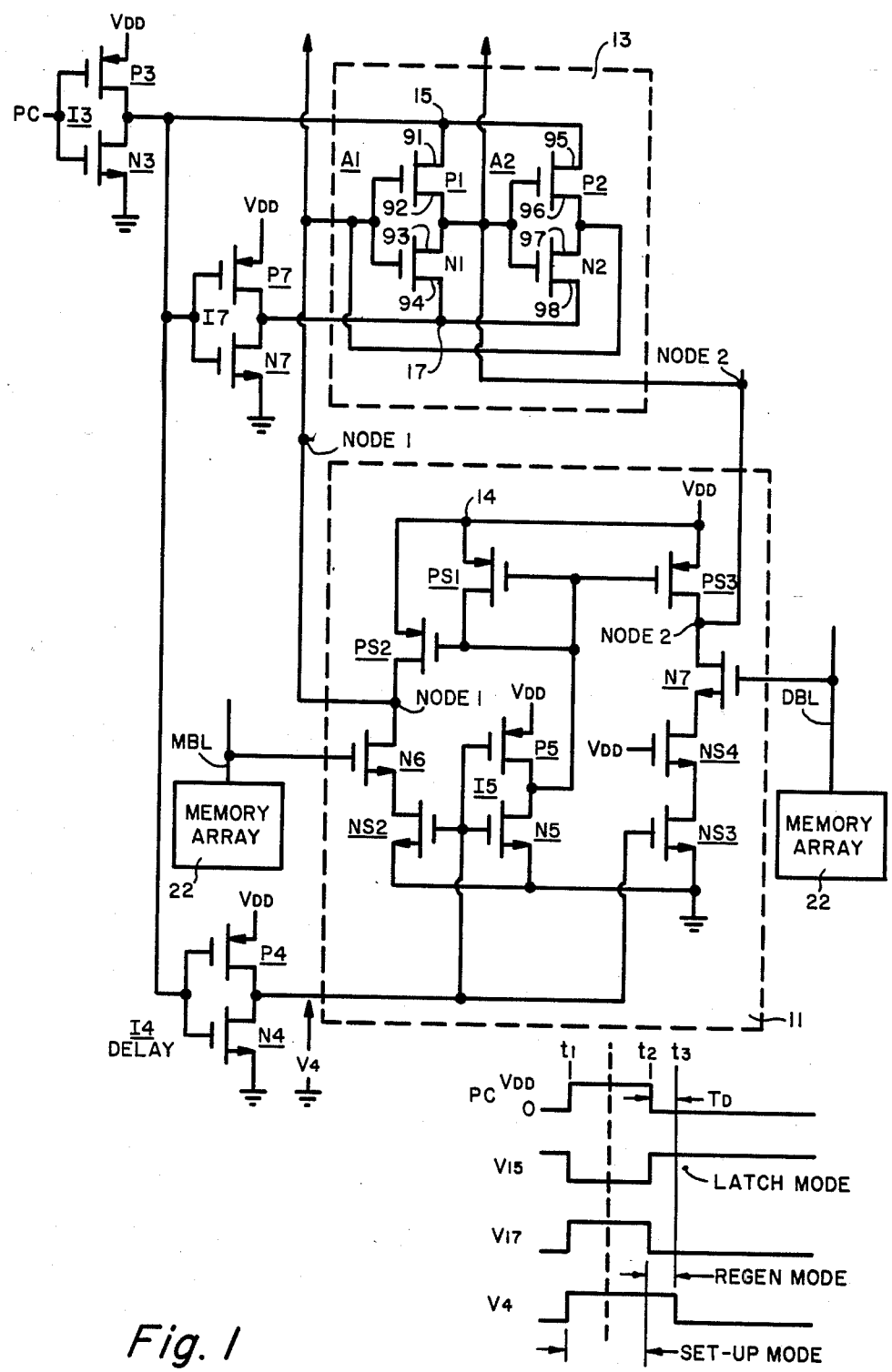
FIG. 1 is a schematic diagram of a circuit embodying the invention.

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor", when used without limitation in the appended claims, is used in a generic sense.

In the FIGURES, enhancement type IGFETs of P conductivity type are identified by the letter P followed by a particular reference numeral; and enhancement type IGFETs of N-conductivity type are identified by the letter N followed by a particular reference numeral. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.
2. Conduction occurs when the applied gate-to-source potential ($V_{GS}$) is in a direction to turn on the transistor and is greater in magnitude than a given value, which is defined as the threshold voltage ($V_T$) of the transistor. To turn on a P-type transistor its gate voltage ($V_G$) has to be more negative than its source voltage ($V_S$) by at least $V_T$. To turn on an N-type transistor its $V_G$ has to be more positive than its $V_S$ by $V_T$.
3. IGFETs are bidirectional in the sense that when an enabling signal is applied to the control electrode, current can flow in either direction in the conduction path defined by the first and second electrodes, i.e. the source and drain are interchangeable.

The circuit of FIG. 1 includes a preamplifying section 11 whose inputs are connected to a master bit line (MBL) and to a dummy bit line (DBL) and whose outputs, nodes 1 and 2, are connected to the input-output (I/O) nodes of an amplifying section 13.

Section 11 includes a current mirror section, comprised of transistors PS1, PS2 and PS3, which is turned-on and off by a complementary inverter I5 consisting of transistors P5 and N5. The source electrodes of P5, PS1, PS2 and PS3 are connected to a terminal 14 to which is applied a fixed operating voltage of $V_{DD}$ volts, which is assumed to be 5 volts. The gate electrodes of PS1, PS2 and PS3 and the drain of PS1 are connected to the drains of N5 and P5 which define the output of inverter I5. The drain of PS2 is connected to node 1 and the drain of PS3 is connected to node 2. The conduction path of an input signal responsive transistor N6 is connected in series with the conduction path of a pull down switching transistor NS2 between node 1 and ground. The conduction path of an input signal responsive transistor N7 is connected in series with the series connected conduction paths of a pull down switching transistor NS3 and an offsetting transistor NS4 between node 2 and ground.

The gate electrodes of NS2 and NS3 and the gate electrodes of P5 and N5, which define the input of I5, are connected to the output of an inverter I4 whose input is connected to the output of an inverter I3. As detailed below, when the output of I4 is low, preamplifier 11 is disabled and when its output is high, preamplifier 11 is enabled. Furthermore, as detailed below, I4 is designed such that the high-to-low transition at the output of I4 is significantly slower than its low-to-high transition. This may be accomplished, for example, by skewing the inverter, i.e. transistor N4 is made a smaller, higher impedance device, than P4.

Signals read-out from a memory cell (not shown) in a memory array 22 are applied to the master bit line (MBL) which is connected to the gate electrode of N6. In this embodiment, a memory signal read-out of array 22 and applied to MBL having a value more positive than 4.8 volts (i.e. 4.8 to 5.0 volts) is arbitrarily defined as a logic "0", while a memory signal applied to MBL having a value of less than 4.7 volts is arbitrarily defined as a logic "1".

A dummy signal generated in memory array 22 is applied to the dummy bit line (DBL) which is connected to the gate electrode of N7. In this embodiment, the dummy signal is designed to be approximately equal to, and to track, the logic "0" level signals, which are typically 4.9 volts, applied to MBL. To ensure than a logic "0" level is correctly sensed when equal voltage levels are applied to the gates of N6 and N7, transistors NS4, biased to function as an offsetting resistor, is connected via NS3 between the source electrode of N7 and ground. The resistance presented by NS4 makes the conductivity of N7 less than that of N6 whereby for the same voltage (e.g. 4.9 volts) applied to their gates, the voltage (V1) at the drain (node 1) of N6 will be typically 2.2 volts while the voltage (V2) at the drain (node 2) of N7 will typically be 2.5 volts, when preamplifier 11 is enabled.

The amplifying section 13 includes amplifier stages A1 and A2, each amplifier stage comprising a pair of transistors (P1, N1; and P2, N2) of complementary conductivity type which are operated in the source follower mode during one portion of a sense cycle and in the common source mode during another portion of a sense cycle. The electrodes (regions) of transistors P1, N1, P2 and N2, defining the ends of their conduction channels are used interchangeably as sources or drains and therefore are not particularly identified as sources or drains in FIG. 1.

The signal input of stage A1, comprising the gate electrodes of N1 and P1, and the signal output of stage A2, comprising electrodes 96 and 97 of P2 and N2, are connected to node 1. The signal output of stage A1, comprising electrodes 92 and 93 of P1 and N1, and the signal input of stage A2, comprising the gate electrodes of N2 and P2, are connected to node 2. Electrodes 91 of P1 and 95 of P2 are connected to a first power terminal (or line) 15. Electrodes 94 of N1 and 98 of N2 are connected to a second power terminal (or line) 17. Line 15 is connected to the output of inverter I3 and line 17 is connected to the output of inverter I7 whose input is connected to the output of I3. When the input signal (PC) to I3 is low, its output drives line 15 to $V_{DD}$ volts and causes I7 to drive line 17 to ground. When PC is high, I3 applies ground to line 15 and I7 applies $V_{DD}$ to line 17. Hence line 17 is always driven to a complementary voltage condition to that existing on line 15.

As detailed below, a positive-going precharge pulse (PC) is applied to the input of inverter I3 concurrent with the read-out of a memory cell signal onto MBL and of a dummy signal onto DBL.

The operation of the circuit of FIG. 1 will now be discussed for: (a) The "set-up mode"—In this mode PC goes from low-to-high and continues high, causing preamplifier 11 to be enabled and the stages of amplifier 13 to be operated in the source follower mode; b) The "regenerative mode"—In this mode, which occurs immediately after PC goes from high-to-low, the preamplifier is still enabled but the amplifier stages are now operated as inverters; and c) The "latch mode"—In this mode, which occurs a time $T_D$ after PC goes low, the preamplifier is disabled and the stages of amplifier 13 are operated as standard cross-coupled inverters.

The set-up mode begins when PC goes high causing the output of I3 to go low and the output (V4) of I4 to go high enabling preamplifier 11 since, V4-high turns-ON NS2 and NS3, providing a ground return for the source electrodes of N6 and N7 and, turns-ON N5 activating the current mirror. When N5 is ON, a current, IS1, flows from terminal 14 through the source-to-drain path of transistor PS1 and the drain-to-source path of N5 to ground. IS1 establishes a given gate-to-source potential ($V_{GS}$) across PS1, which is also applied across PS2 and PS3. Currents IS2 and IS3, proportional to IS1 (the ratio being a function of the sizes of PS2 and PS3 to PS1) then flow through the respective source-to-drain paths of PS2 and PS3 into nodes 1 and 2. Currents IS1 and IS2 are substantially constant when PS2 and PS3 are turned-on and tend to charge the nodes towards $V_{DD}$.

Since NS2 and NS3 are switched-on hard concurrent with the turn-on of PS2 and PS3, the voltage (V1) at node 1 is then determined mostly by the conductivity of N6 and the voltage (V2) at node 2 is then determined mostly by the conductivity of N7. The conductivity of N6 is a function of the voltage level on MBL and the conductivity of N7 is a function of the voltage level on DBL (as modified by the role of NS4, discussed above). Concurrent with the enabling of preamplifier 11 the information contained in a selected memory cell (not shown) in array 22 is read-out and applied to MBL and to the gate of N6 and, at the same time, a dummy signal is applied to the dummy bit line (DBL) and to the gate of N7. By way of example, assume that within 15 nanoseconds following the read-out of the contents of a memory cell MBL is placed at either 4.9 volts (logic "0") or 4.6 volts (logic "1"), and DBL is at 4.9 volts. Assume further that in response to the signals applied to its gate, N6 causes V1 to be driven to either 2.2 volts (in response to a logic "0") or 2.8 volts (in response to a logic "1"), and that in response to the 4.9 volt signal at its gate, N7 causes V2 to be driven to 2.5 volts. Thus, while $V_2$ is at 2.5 volts, $V_1$ is either at 2.2 volts or 2.8 volts. For the input differential of 0.3 volt (i.e., 4.9 v–4.6 v) between VH and VL on MBL a differential of 0.6 volt (i.e., 2.8–2.2 v) is produced at node 1. Hence, preamplifier 11 is assumed to have a small signal voltage gain of 2. In addition, preamplifier 11 level shifts the dummy and memory cell signals to produce a signal at node 2 which is approximately equal to $V_{DD}/2$ (i.e., 2.5 volts) and a signal at node 1 which is centered about $V_{DD}/2$ since V1 is driven to 2.8 volts or 2.2 volts which may be represented as 2.5±0.3 volts. Setting the voltages at nodes 1 and 2 close to $V_{DD}/2$ ensures that amplifying section 13 is operated at, or near, a point of maximum voltage gain. This makes regeneration most effective when the amplifying stages are later operated as inverters.

Figure 2A:
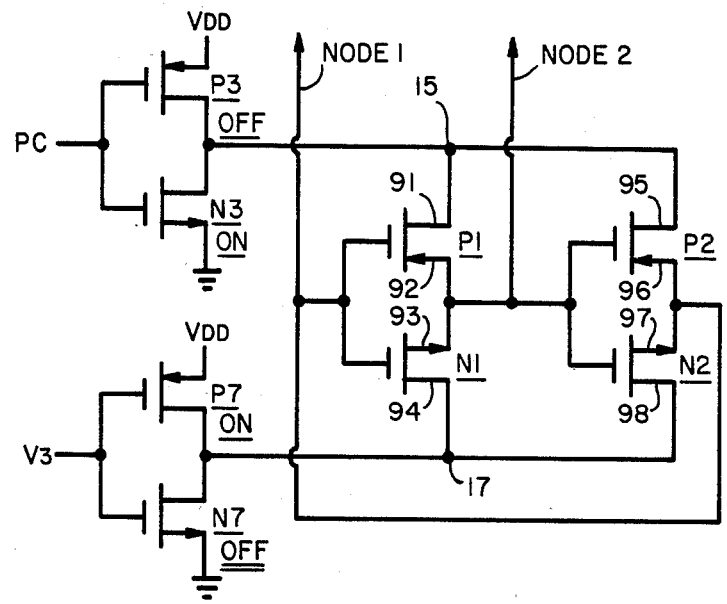
FIGS. 2A and 2B are schematic diagrams of the amplifier section of FIG. 1 for two different operating voltage conditions.

During the set-up mode, the transistors in amplifying section 13 are operated in the source follower mode, as illustrated in FIG. 2A. When PC is high, the output of I3 is low and the output of I7 is high. $V_{DD}$ volts is then applied via P7 of I7 to line 17 and ground is applied via N3 of I3 to line 15. When $V_{DD}$ and ground are respectively applied to lines 17 and 15, electrodes 91, 94, 95, and 98 of P1, N1, P2 and N2, respectively, function as the drain electrodes of their respective transistors, and electrodes 92, 93, 96 and 97 function as the source electrodes of their respective transistors. Thus the source electrodes of N1 and P1 are connected to node 2 and to the gate electrodes of N2 and P2 and the source electrodes of N2 and P2 are connected to node 1 and to the control electrodes of N1 and P1 with N1, P1, N2 and P2 conducting in the source follower mode.

In the discussion of the operation to follow, it is assumed that the threshold voltage ($V_T$) of each one of the transistors is equal to 1 volt. It is also assumed that transistors N1, N2, P1 and P2 are relatively small in comparison to, and have significantly higher impedances than, the transistors in preamplifying stage 11 whereby, when the preamplifier is enabled, the values of V1 and V2 are determined primarily, though not exclusively, by preamplifier 11.

Although V1 and V2 are primarily controlled by preamplifying section 11, the source follower action of the transistors in section 13 tends to maintain V1 and V2 within a relatively narrow voltage range. By way of example, where V2 is 2.5 volts, V1 will be within $V_T$ volts (i.e., 2.5±1 volt) of V2. If V1 is, for example, more positive than 3.5 volts, P2 will conduct in a direction to cause V1 to decrease to a value within $V_T$ volts of V2. On the other hand, if V1 is less than 1.5 volts, N2 would conduct in a direction to cause V1 to go more positive restoring V1 to a condition of V2 minus $V_T$. Thus, amplifier 13 tends to maintain nodes 1 and 2 within $V_T$ volts of each other. This feature of the amplifier, tends to eliminate, during the early part of the set up mode, those voltage differentials existing between nodes 1 and 2 resulting from data previously read-out—which is assumed to be incorrect. Thus, the source follower action assists in restoring I/O nodes 1 and 2 to a nearly balanced condition, and then enabling a small signal differential produced by the preamplifier 11 to be coupled to and safely stored at I/O nodes 1 and 2.

Figure 2B:
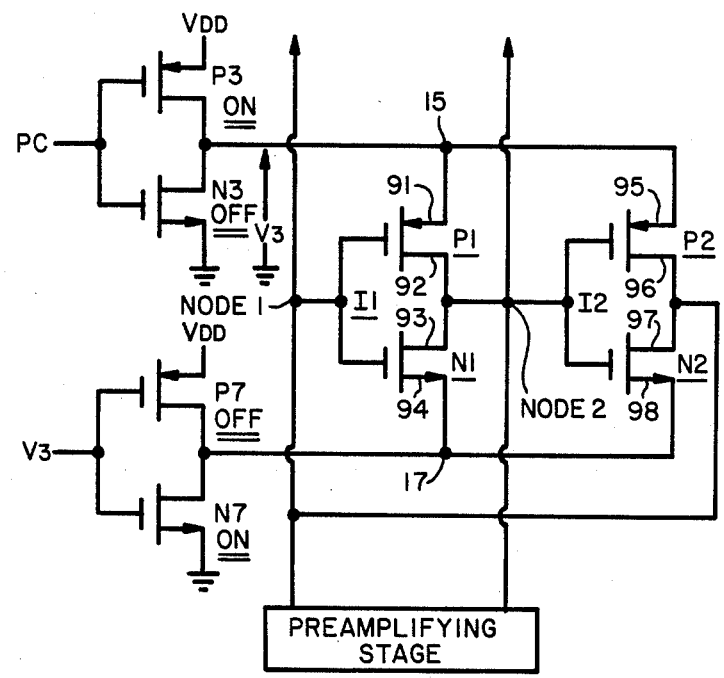

The set-up mode ends and the regenerative mode begins when PC makes a transition from high-to-low at time $t_2$. As detailed below, at time $t_2$, the operating potential to amplifier 13 is "inverted" while preamplifier 11 remains enabled for a period $T_D$, until time $t_3$. When PC goes low, N3 is turned-off and P3 is turned-on causing the voltage on line 15 to be driven from ground to $V_{DD}$ volts (via P3). Concurrently, the high output of I3 causes P7 to turn-off and N7 to turn-on. The turn-on of N7 causes the voltage on line 17 to go from $V_{DD}$ volts to ground (via N7). Hence at time $t_2$ the polarity of the operating potential across the amplifier is "transposed", "inverted" or "reversed", and transistors N1, P1, N2 and P2 are now operated in the common source mode with N1 and P1 forming a complementary inverter and P2 and N2 forming another complementary inverter. As shown in FIG. 2B, electrodes 91, 94, 95 and 98 of P1, N1, P2 and N2, respectively, now function as the source electrodes of their transistors, and electrodes 92, 93, 96 and 97 now function as the drain electrodes of their respective transistors. Beginning with time $t_2$, inverters I1 and I2 are cross-coupled and tend to regeneratively amplify the signal differential at nodes 1 and 2. However, recall that I4 is designed to respond slowly to the positive going signal at its input whereby the output of I4 does not go low until time $t_3$, a time delay ($T_D$), after $t_2$ when PC goes low. During the time $t_2$ to $t_3$ which defines the "regenerative" period, preamplifier 11 continues to be enabled and it continues to have primary control of the voltages at nodes 1 and 2. The combined action of preamplifier 11 and amplifier 13 is best understood by recalling that the effective impedance of the devices forming inverters A1 and A2 are significantly greater than the impedance of the devices forming the preamplifying stage.

For the condition of A1 and A2 operated as inverters, the conduction path of P2 is connected (via P3) between $V_{DD}$ and node 1 in parallel with PS2 and the conduction path of N2 is connected (via N7) between node 1 and ground. In a similar manner, P1 is connected in parallel with PS3 and N1 is connected in parallel with N7, NS4 and NS3. Obviously, if the effective impedances of P1, N1, P2 and N2 is changed, some changes will be produced at nodes 1 and 2. However, since the effective impedances of the amplifier devices are greater than the effective impedances of the preamplifier device, the extent to which the amplifier devices can modify the voltage values established by the preamplifier is limited. Consequently, preamplifier 11 still has primary control of the voltages at nodes 1 and 2. However, inverters A1 and A2, because of their positive feedback connection, function to modify the effective impedances at nodes 1 and 2 in a direction to cause additional amplification of the voltage difference existing previously at nodes 1 and 2. By way of example, if V1 is more positive than V2, V1 tends to render N1 more conductive than P1. N1 will then tend to lower the potential at node 2, causing P2 to be more conductive than N2. This tends to further increase the voltage at node 1 and raise that voltage towards $V_{DD}$ volts.

On the other hand, if, at time $t_2$, V1 is less positive than V2, then P1 will be rendered more conductive than N1 and N2 will be rendered more conductive than P2. P1 and N1 then function to raise the potential at node 2 while P2 and N2 function to decrease the potential at node 1. The effective voltage gain of the combination of preamplifier 11 and amplifier 13 is thus increased during the regenerative mode. Thus, when stages A1 and A2 are turned into inverters after time $t_2$, the gain of the preamplifier/amplifier combination increases from a value of 2 prior to $t_2$ to a value of 6 after $t_2$. Hence, after $t_2$, V1 may be assumed to be driven to either 3.4 volts (for a logic "1" on MBL) or 1.6 volts (for a logic "0" on MBL).

Since the preamp 11 maintains control during the transition period $T_D$, the circuit is protected against any imbalance at nodes 1 and 2 and in the switching of the inverters of amplifier 13. When transistors N1, P1, N2, P2 are switched from the source follower mode to the common source mode, the voltages at nodes 1 and 2, which reflect the values of memory and dummy signals read-out, cannot be upset since the preamplifying stage still controls, to a first approximation, the value of the signals at these nodes. When stages A1 and A2 are switched from the source follower mode to the inverting mode, the impedance at nodes 1 and 2 is modified and the gain of stages A1 and A2 forming amplifier 13 is now significantly greater than 1. However, the preamplifier maintains the gain of the combination finite and prevents the two cross-coupled inverters from going into a latch mode.

An advantage of inverting the voltages applied to power lines 15 and 17 is that the concurrent application of a positive-going power pulse to line 15, and a negative-going power pulse to line 17 tends to cause a cancellation of the switching transients capacitively coupled to nodes 1 and 2 and ensures that the nodal signals are not disturbed. For example, when PC goes low, the voltage on power terminal 15 goes from zero to 5 volts while the voltage on power terminal 17 goes from 5 volts to zero volts. The positive and negative voltage steps applied to terminals 15 and 17, respectively, are coupled via the gate-to-source and source-to-drain capacitances of the transistors (P1, N1, P2 and N2) to nodes 1 and 2. The symmetrical voltage switching as well as the symmetrical arrangement of the 4 transistors aids in cancelling the switching transients. By way of example, the positive voltage step on line 15 may be coupled via the source-to-gate capacitance of transistors P1 to node 1. Concurrently, the negative-going voltage step applied to line 17 is coupled via the gate-to-source capacitance of transistor N1 to node 1. The positive and negative voltage steps applied to lines 15 and 17 have a negligible effect on the voltages at nodes 1 and 2 due to the cancellation of the capacitively coupled transients. Consequently, switching the operating potential applied to stages of amplifier 13 and changing their mode of operation from source follower to common source mode has very little effect on the signals at nodes 1 and 2 and will not significantly disturb the signal level at these nodes.

At time t3, when the output (V4) of I4 goes low, the regenerative mode is terminated and the latch mode is initiated. When preamplifier 11 turns-off, cross-coupled inverters A1 and A2 of amplifier 13 cause their input-/output nodes to be driven to complementary voltage levels which are at, or near, the operating voltage levels applied to the system as detailed below.

At time t3, a time $T_D$ after the high-to-low transition of PC, the output of Inverter I4 goes low, turning-OFF N5, NS2 and NS3, and turning-ON P5. The turn-off of N5 and the turn-on of P5 stops conduction through PS1 and interrupts the flow of current through PS2 and PS3 into nodes 1 and 2. Concurrently, NS2 and NS3 are turned-off and current is no longer drawn out of nodes 1 and 2 by preamplifier 11. Preamplifying stage 11 now appears as an extremely high impedance connected to nodes 1 and 2. Amplifier 13 now controls the voltage at nodes 1 and 2 since the impedances of its devices are now relatively low compared to the impedances of the preamplifier. At time t3, cross-coupled inverters I1 and I2 whose regenerative feedback action is now unlimited, drive node 1 to either $V_{DD}$ or ground and node 2 to the complementary voltage condition, depending on the values of V1 and V2 when the preamplifier is disabled at time t3. For example, if at time t3, node 1 is at 1.6 volts and node 2 is at 2.5 volts, then P1 conducts more than N1 driving node 2 more positive than 2.5 v. This, in turn, causes N2 to conduct more than P2, causing node 1 to be driven towards ground. Since the preamplifier is turned-off, the regenerative process continues with node 1 being driven to, or close to, ground via N2 and N7 and node 2 being driven to, or close to, $V_{DD}$ via P1 and P3. Similarly if, at time t3, node 1 is at 3.4 volts and node 2 is at 2.5 volts, then node 1 is quickly driven to $V_{DD}$ volts via P2 and P3 and node 2 is quickly driven to ground via N1 and N3.

Thus, beginning with time t3, cross-coupled inverters I1 and I2 have full control and drive nodes 1 and 2 to the operating voltage levels ($V_{DD}$ or ground) depending on the value of signals applied to MBL and DBL.

The switching transients caused by turning off the preamplifying and current mirror at time t3 does not have a significant effect and cannot upset the data because of the latching action of A1 and A2, the increased differential signals produced at nodes 1 and 2 during the regenerative mode, and the steadily increasing voltage gain as PS2, PS3, NS2, NS3 turn off. It should also be appreciated that at time t3, nodes 1 and 2 are isolated from the master and dummy bit lines, the preamplifier and amplifier sections draw no current from the memory cell array and can respond rapidly since nodes 1 and 2 have significantly less capacitance than the bit lines.

Also, in this design, the master and dummy bit lines need not be driven into a latched 5 volt or zero volt level. This reduces dynamic power dissipation and avoids a major cause of pattern sensitivity.

The assumed $\Delta V$ of 0.3 volts was used by way of example only.

The circuit of FIG. 1 may be operated with memory signals having even smaller voltage differences between the "1" and the "0" levels, and, of course, the circuit may be operated with input signals having larger amplitude differences between the logic "1" and "0".

What is claimed is:

1. The combination comprising:
   first and second power terminals for the application therebetween of an operating potential;
   first and second input/output (I/O) nodes;
   means for coupling signals to said input/output nodes including a preamplifier stage having first and second signal inputs and first and second signal outputs, said first signal output being connected to said first input/output node and said second signal output being connected to said second input/output node;
   first, second, third and fourth transistors; said first and third transistors being of one conductivity type and said second and fourth transistors being of complementary conductivity type, each transistor having source and drain electrodes defining the ends of a conduction path and a control electrode;
   means connecting the control electrodes of said first and second transistors to said first node;
   means connecting the control electrodes of said third and fourth transistors to said second node;
   means connecting the conduction path of said first transistor between said first power terminal and said second node and the conduction path of said second transistor between said second node and said second power terminal;
   means connecting the conduction path of said third transistor between said first power terminal and said first node and the conduction path of said fourth transistor between said first node and said second power terminal; and
   means for selectively controlling the operating potential applied across said first and second power terminals for operating said first, second, third and fourth transistors in the source follower mode during one time interval and in the common source mode during another time interval.

2. The combination comprising:
   first and second power terminals for the application therebetween of an operating potential;
   first and second input/output (I/O) nodes;
   means for coupling signals to said input/output nodes including a selectively enabled preamplifier stage having first and second signal inputs and first and second signal outputs, said first signal output being connected to said first input/output node and said second signal output being connected to said second input/output node.
   first, second, third and fourth transistors; said first and third transistors being of one conductivity type and said second and fourth transistors being of complementary conductivity type, each transistor having source and drain electrodes defining the ends of a conduction path and a control electrode;

means connecting the control electrodes of said first and second transistors to said first node;

means connecting the control electrodes of said third and fourth transistors to said second node;

means connecting the conduction path of said first transistor between said first power terminal and said second node and the conduction path of said second transistor between said second node and said second power terminal;

means connecting the conduction path of said third transistor between said first power terminal and said first node and the conduction path of said fourth transistor between said first node and said second power terminal; and means for selectively controlling the operating potential applied across said first and second power terminals for operating said first, second, third and fourth transistors in the source follower mode during one time interval and in the common source mode during another time interval.

3. The combination as claimed in claim 2 wherein said preamplifier stage includes:

first and second signal responsive transistors;

means for applying signals to the control electrodes of said first and second signal responsive transistors;

first and second switching transistors;

means connecting the conducting path of said first switching transistor in series with the conduction path of said first signal responsive transistor between said first I/O node and a first point of operating potential;

means connecting the conduction path of said second switching transistor in series with the conduction path of said second signal responsive transistor between said second I/O node and a first point of operating potential;

first and second selectively enabled relatively constant current carrying transistors having their conduction paths connected between a second point of operating potential and said first and second I/O nodes, respectively; and means for selectively and concurrently enabling said first and second switching transistors and said first and second relatively constant current carrying transistors.

4. The combination as claimed in claim 3 wherein all of said transistors are insulated-gate field-effect transistors of the enhancement type.

5. The combination comprising:

first and second power terminals for the application therebetween of an operating potential;

first and second input/output nodes;

first, second, third and fourth insulated-gate field-effect transistors (IGFETS), said first and third IGFETS being of one conductivity type and said second and fourth transistors being of complementary conductivity type, each IGFET having source and drain electrodes defining the ends of a conduction path and a control electrode;

means connecting the control electrodes of said first and second IGFETS to said first node;

means connecting the control electrodes of said third and fourth IGFETS to said second node;

means connecting the conduction path of said first IGFET between said first power terminal and said second node and the conduction path of said second IGFET between said second node and said second power terminal;

means connecting the conduction path of said third IGFET between said first power terminal and said first node and the conduction path of said fourth IGFET between said first node and said second power terminal; and means for selectively applying a voltage to said first power terminal which is positive with respect to the voltage at said second power terminal during one time interval, and for applying a voltage to said first power terminal which is negative with respect to the voltage at said second power terminal during another time interval;

preamplifying means having first and second signal inputs and first and second signal outputs; and means connecting the first and second signal outputs of said preamplifying means to said first and second input/output nodes, respectively.

6. A sense amplifier comprising:

a preamplifier stage having first and second signal inputs and first and second signal outputs;

an amplifying means having first and second input/output (I/O) nodes, said first I/O node being connected to said first signal output and said second I/O node being connected to said second signal output, said amplifying means including two stages, the input of one stage and the output of the other being connected to said first I/O node and the input of the other stage and the output of the one stage being connected to said second I/O node, said amplifying means having first and second power lines for the application therebetween of an operating potential;

means for selectively enabling said preamplifier stage; and means coupled to said first and second power lines for selectively inverting the operating potential applied across said power lines, the potential on said first line being positive with respect to the potential on said second line during one time interval and being negative with respect to the potential on said second line during another time interval, said stages of said amplifying means being operated in the voltage follower mode during said one time interval and in the inverting mode during said another time interval.

7. An amplifier comprising:

first and second input/output (I/O) nodes;

first and second amplifying stages, each stage having a signal input and a signal output, and first and second power terminals for the application therebetween of an operating potential;

means connecting the signal input of the first stage and the signal output of the second stage to said first I/O node and the signal input of the second stage and the signal output of the first stage to said second I/O node; and means coupled to said first and second power terminals of said amplifying stages for selectively applying a first potential across said first and second power terminals for operating said first and second amplifying stages as voltage followers during one time interval and for applying a second potential across said first and second power terminals of said amplifying stages during another time interval for operating said first and second amplifying stages as inverters;

preamplifying means having first and second signal inputs and first and second signal outputs; and means connecting the first and second signal outputs of said preamplifying means to said first and second input/output nodes, respectively.

8. A method for operating an amplifier comprising the steps of:

first placing said amplifier in a controlled low gain state and concurrently applying an input signal to said amplifier;

then placing said amplifier in a controlled higher gain state to further amplify said input signal; and then placing said amplifier in a regenerative virtually infinite gain mode causing said amplifier to be driven to a latch condition.

9. The method as claimed in claim 8 wherein the step of placing said amplifier in a controlled low gain state includes applying an operating potential to said amplifier in one sense for operating said amplifier in a voltage follower mode; and wherein the step of placing said amplifier in a controlled higher gain state includes applying the operating potential to said amplifier in an opposing sense to said one sense for operating said amplifier in an amplifying mode.

10. An amplifier comprising:

a preamplifier stage and an amplifier stage;

means coupling an input signal to said preamplifier;

means coupling the output of said preamplifier to the input of said amplifier stage;

means for controlling the turn-on and turn-off of said preamplifier, and means controlling the polarity and magnitude of the operating potential applied to said amplifier stage for selectively operating said preamplifier and amplifier stage in:

(a) a first mode wherein the gain of the preamplifier/amplifier combination is controlled and low;

(b) a second mode wherein the gain of the preamplifier/amplifier combination is controlled and substantially higher than in said first mode; and (c) a third mode wherein said amplifier stage is operated as a regenerative latch exhibiting extremely high gain until driven to a latch condition.

11. The combination as claimed in claim 10 wherein said means for controlling the turn-on and turn-off of said preamplifier includes means for turning-off said preamplifier during said third mode.

12. The combination as claimed in claim 10 wherein said means controlling the polarity and magnitude of the operating potential applied to said amplifier stage includes means for:

(a) applying said operating potential in one sense during said first mode for then operating said amplifier stage in a voltage follower mode; and (b) for applying the operating potential in an opposite sense during said second mode for operating said amplifier stage in a voltage amplifying mode.

* * * * *

UNITED STATES PATENT AND TRADEMARK OFFICE
CERTIFICATE OF CORRECTION

PATENT NO. : 4,558,240

DATED : Dec. 10, 1985

INVENTOR(S) : Roger G. Stewart

It is certified that error appears in the above-identified patent and that said Letters Patent is hereby corrected as shown below:

Col. 3, line 15, change "than" to --- that ---.

Col. 4, lines 6-7, change "turn-s-ON" to --- turns-ON ---.

Col. 6, line 2, change "impedance" to --- impedances ---.

Col. 6, line 11, change "changes" to --- change ---.

Col. 7, line 63, change "mirror" to --- mirrors ---.

Col. 7, line 63, change "does" to --- do ---.

Signed and Sealed this

First Day of April 1986

[SEAL]

Attest:

Attesting Officer

DONALD J. QUIGG

Commissioner of Patents and Trademarks